(12) United States Patent
Fujimura et al.

(10) Patent No.: US 8,719,739 B2
(45) Date of Patent: May 6, 2014

(54) METHOD AND SYSTEM FOR FORMING PATTERNS USING CHARGED PARTICLE BEAM LITHOGRAPHY

(71) Applicant: D2S, Inc., San Jose, CA (US)

(72) Inventors: Akira Fujimura, Saratoga, CA (US);
Anatoly Aadamov, Palo Alto, CA (US);
Eldar Khaliullin, San Jose, CA (US);
Ingo Bork, Mountain View, CA (US)

(73) Assignee: D2S, Inc., San Jose, CA (US)

( * ) Notice: Subject to any disclaimer, the term of this patent is extended or adjusted under 35 U.S.C. 154(b) by 0 days.

(21) Appl. No.: 13/862,472

(22) Filed: Apr. 15, 2013

(65) Prior Publication Data

US 2013/0283218 A1    Oct. 24, 2013

Related U.S. Application Data

(63) Continuation-in-part of application No. 13/236,610, filed on Sep. 19, 2011.

(60) Provisional application No. 61/625,789, filed on Apr. 18, 2012.

(51) Int. Cl.
*G06F 17/50*    (2006.01)

(52) U.S. Cl.
USPC .......................................... 716/53

(58) Field of Classification Search
USPC .......................................... 716/53
See application file for complete search history.

(56) References Cited

U.S. PATENT DOCUMENTS

| | | | |
|---|---|---|---|
| 6,037,601 A | 3/2000 | Okunuki | |
| 6,416,912 B1 | 7/2002 | Kobayashi et al. | |
| 6,917,048 B2 | 7/2005 | Fujiwara et al. | |
| 7,269,819 B2 * | 9/2007 | Hoshino | 716/51 |
| 7,759,027 B2 | 7/2010 | Fujimura et al. | |

(Continued)

FOREIGN PATENT DOCUMENTS

| | | |
|---|---|---|
| WO | 03036386 A | 5/2003 |
| WO | 2010025031 A2 | 3/2010 |
| WO | 2010025032 A | 3/2010 |
| WO | 2011025795 A1 | 3/2011 |

OTHER PUBLICATIONS

International Search Report and Written Opinion dated Apr. 27, 2012 for PCT Application No. PCT/US2011/055535.
International Search Report and Written Opinion dated Apr. 30, 2012 for PCT Application No. PCT/US2011/055536.
International Search Report and Written Opinion dated Dec. 20, 2012 for PCT Application No. PCT/US2012/054526.

(Continued)

*Primary Examiner* — Suresh Memula
(74) *Attorney, Agent, or Firm* — The Mueller Law Office, P.C.

(57) ABSTRACT

A method for mask data preparation (MDP) is disclosed, in which a set of shots is determined that will form a pattern on a reticle, where the determination includes calculating the pattern that will be formed on a substrate using an optical lithographic process with a reticle formed using the set of shots. A method for optical proximity correction (OPC) or MDP is also disclosed, in which a preliminary set of charged particle beam shots is generated using a preliminary mask model, and then the shots are modified by calculating both a reticle pattern using a final mask model, and a resulting substrate pattern. A method for OPC is also disclosed, in which an ideal pattern for a photomask is calculated from a desired substrate pattern, where the model used in the calculation includes only optical lithography effects and/or substrate processing effects.

33 Claims, 10 Drawing Sheets

(56) References Cited

U.S. PATENT DOCUMENTS

| | | |
|---|---|---|
| 7,799,489 B2 | 9/2010 | Fujimura et al. |
| 7,901,850 B2 | 3/2011 | Fujimura et al. |
| 8,062,813 B2 | 11/2011 | Zable et al. |
| 8,221,939 B2 | 7/2012 | Zable et al. |
| 2002/0129328 A1 | 9/2002 | Komatsuda |
| 2005/0053850 A1 | 3/2005 | Askebjer et al. |
| 2005/0075819 A1 | 4/2005 | Paxton et al. |
| 2005/0287451 A1 | 12/2005 | Hudek et al. |
| 2007/0114463 A1 | 5/2007 | Nakasugi et al. |
| 2007/0162889 A1 | 7/2007 | Broeke et al. |
| 2008/0116398 A1 | 5/2008 | Hara et al. |
| 2008/0213677 A1 | 9/2008 | Saito |
| 2010/0055580 A1 | 3/2010 | Fujimura et al. |
| 2010/0055585 A1 | 3/2010 | Fujimura et al. |
| 2010/0058279 A1* | 3/2010 | Fujimura et al. ............ 716/19 |
| 2010/0058282 A1 | 3/2010 | Fujimura et al. |
| 2010/0209834 A1 | 8/2010 | Yao et al. |
| 2011/0045409 A1 | 2/2011 | Fujimura |
| 2011/0053056 A1 | 3/2011 | Fujimura et al. |
| 2011/0177458 A1 | 7/2011 | Kotani et al. |
| 2011/0191727 A1 | 8/2011 | Fujimura et al. |
| 2012/0084740 A1 | 4/2012 | Fujimura et al. |
| 2013/0070222 A1 | 3/2013 | Fujimura |

OTHER PUBLICATIONS

International Search Report and Written Opinion dated Sep. 13, 2012 for PCT Patent Application No. PCT/US2012/043042.
Notice of Allowance and Fees due dated Mar. 6, 2013 for U.S. Appl. No. 13/168,954.
Office Action dated Dec. 24, 2012 for U.S. Appl. No. 13/168,954.
Office Action dated Jul. 10, 2012 for U.S. Appl. No. 13/168,954.
Office Action dated May 9, 2013 for U.S. Appl. No. 13/269,618.
Notice of Allowance and Fees dated Aug. 21, 2013 for U.S. Appl. No. 13/924,019.
Notice of Allowance and Fees dated Sep. 30, 2013 for U.S. Appl. No. 13/269,618.
Office Action dated Aug. 30, 2013 for U.S. Appl. No. 13/236,610.
Office Action dated Oct. 1, 2013 for U.S. Appl. No. 13/862,475.
Chua et al., "Optimization of Mask Shot Count Using MB-MDP and Lithography Simulation", Photomask Technology 2011, Oct. 13, 2011, pp. 816632-1-816632-11, vol. 8166, SPIE, Bellingham, Wahshington, U.S.A.
International Search Report and Written Opinion dated Jul. 24, 2013 for PCT Application No. PCT/US2013/036671.
International Search Report and Written Opinion dated Jul. 29, 2013 for PCT Application No. PCT/US2013/036669.

* cited by examiner

METHOD AND SYSTEM FOR FORMING PATTERNS USING CHARGED PARTICLE BEAM LITHOGRAPHY

RELATED APPLICATIONS

This application claims priority from U.S. Provisional Patent Application No. 61/625,789 filed on Apr. 18, 2012, entitled "Method And System For Forming Patterns Using Charged Particle Beam Lithography," which is hereby incorporated by reference for all purposes. This application also claims priority from U.S. patent application Ser. No. 13/236,610 filed on Sep. 19, 2011 and entitled "Method And System For Optimization Of An Image On A Substrate To Be Manufactured Using Optical Lithography", published on Mar. 21, 2013 as U.S. Patent Publication No. 2013/0070222, which is hereby incorporated by reference for all purposes. This application also is related to 1) U.S. patent application Ser. No. 13/862,471 filed on Apr. 15, 2013 and entitled "Method and System For Forming Patterns Using Charged Particle Beam Lithography"; 2) U.S. patent application Ser. No. 13/862,475 filed on Apr. 15, 2013 and entitled "Method and System For Forming Patterns Using Charged Particle Beam Lithography"; and 3) U.S. patent application Ser. No. 13/862,476 filed on Apr. 15, 2013 and entitled "Method And System For Critical Dimension Uniformity Using Charged Particle Beam Lithography"; all of which are hereby incorporated by reference for all purposes.

BACKGROUND OF THE DISCLOSURE

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit (I.C.). Other substrates could include flat panel displays, holographic masks or even other reticles. While conventional optical lithography uses a light source having a wavelength of 193 nm, extreme ultraviolet (EUV) or X-ray lithography are also considered types of optical lithography in this application. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, directed self-assembly (DSA) guard bands, or magnetic recording heads. Conventional optical lithography writing machines typically reduce the photomask pattern by a factor of four during the optical lithographic process. Therefore, patterns formed on the reticle or mask must be four times larger than the size of the desired pattern on the substrate or wafer.

In the production or manufacturing of semiconductor devices, such as integrated circuits, non-optical methods may be used to transfer a pattern on a lithographic mask to a substrate such as a silicon wafer. Nanoimprint lithography (NIL) is an example of a non-optical lithography process. In nanoimprint lithography, a lithographic mask pattern is transferred to a surface through contact of the lithography mask with the surface.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane (i.e. of "manhattan" orientation), and 45 degree right triangles (i.e. triangles with their three internal angles being 45 degrees, 45 degrees, and 90 degrees) of certain minimum and maximum sizes. At predetermined locations, doses of electrons are shot into the resist with these simple shapes. The total writing time for this type of system increases with the number of shots. In character projection (CP), there is a stencil in the system that has in it a variety of apertures or characters which may be complex shapes such as rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45-45-90 degree triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection. Shaped beam charged particle beam lithography may use either a single shaped beam, or may use a plurality of shaped beams simultaneously exposing the surface, the plurality of shaped beams producing a higher writing speed than a single shaped beam.

As indicated, in lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce the original circuit design on the substrate by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in conventional optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs". Serifs are small features that can be positioned on an interior or exterior corner of a pattern to sharpen the corner in the final transferred image. It is often the case that the precision demanded of the surface manufacturing process for SRAFs is less than the precision demanded for patterns that are intended to print on the substrate, often referred to as main features. Serifs are a part of a main feature. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of designed features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a designed feature size. Note that for clarity, variations in the design of the OPC are what is being referenced. Manufacturing variations, such as line-edge roughness and corner rounding, will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a designed feature range. There are numerous manufacturing factors that also cause variations, but the OPC component of that overall error is often in the range listed. OPC shapes such as sub-resolution assist features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process. It should also be noted that the accuracy requirement of the SRAF features on the mask may be lower than the accuracy requirements for the designed features on the mask. As process nodes continue to shrink, the size of the smallest SRAFs on a photomask also shrinks For example, at the 20 nm logic process node, 40 nm to 60 nm SRAFs are needed on the mask for the highest precision layers.

Inverse lithography technology (ILT) is one type of OPC technique. ILT is a process in which a pattern to be formed on a reticle is directly computed from a pattern which is desired to be formed on a substrate such as a silicon wafer. This may include simulating the optical lithography process in the reverse direction, using the desired pattern on the substrate as input. ILT-computed reticle patterns may be purely curvilinear—i.e. completely non-rectilinear—and may include circular, nearly circular, annular, nearly annular, oval and/or nearly oval patterns. Since these ideal ILT curvilinear patterns are difficult and expensive to form on a reticle using conventional techniques, rectilinear approximations or rectilinearizations of the ideal curvilinear patterns may be used. The rectilinear approximations decrease accuracy, however, compared to the ideal ILT curvilinear patterns. Additionally, if the rectilinear approximations are produced from the ideal ILT curvilinear patterns, the overall calculation time is increased compared to ideal ILT curvilinear patterns. In this disclosure ILT, OPC, source mask optimization (SMO), and computational lithography are terms that are used interchangeably.

In EUV lithography, OPC features are generally not required. Therefore, the complexity of the pattern to be manufactured on the reticle is less than with conventional 193 nm wavelength optical lithography, and shot count reduction is correspondingly less important. In EUV, however, mask accuracy requirements are very high because the patterns on the mask, which are typically 4× the size of the patterns on the wafer, are sufficiently small that they are challenging to form precisely using charged particle beam technology such as electron beam.

There are a number of technologies used for forming patterns on a reticle, including using optical lithography or charged particle beam lithography. The most commonly used system is the variable shaped beam (VSB), where, as described above, doses of electrons with simple shapes such as manhattan rectangles and 45-degree right triangles expose a resist-coated reticle surface. In conventional mask writing, the doses or shots of electrons are designed to avoid overlap wherever possible, so as to greatly simplify calculation of how the resist on the reticle will register the pattern. Similarly, the set of shots is designed so as to completely cover the pattern area that is to be formed on the reticle. U.S. Pat. No. 7,754,401, owned by the assignee of the present patent application and incorporated by reference for all purposes, discloses a method of mask writing in which intentional shot overlap for writing patterns is used. When overlapping shots are used, charged particle beam simulation can be used to determine the pattern that the resist on the reticle will register. Use of overlapping shots may allow patterns to be written with reduced shot count. U.S. Pat. No. 7,754,401 also discloses use of dose modulation, where the assigned dosages of shots vary with respect to the dosages of other shots. The term model-based fracturing is used to describe the process of determining shots using the techniques of U.S. Pat. No. 7,754,401.

Reticle writing for the most advanced technology nodes typically involves multiple passes of charged particle beam writing, a process called multi-pass exposure, whereby the given shape on the reticle is written and overwritten. Typically, two to four passes are used to write a reticle to average out precision errors in the charged particle beam writer, allowing the creation of more accurate photomasks. Also typically, the list of shots, including the dosages, is the same for every pass. In one variation of multi-pass exposure, the lists of shots may vary among exposure passes, but the union of the shots in any exposure pass covers the same area. Multi-pass writing can reduce over-heating of the resist coating the surface. Multi-pass writing also averages out random errors of the charged particle beam writer. Multi-pass writing using different shot lists for different exposure passes can also reduce the effects of certain systemic errors in the writing process.

SUMMARY OF THE DISCLOSURE

A method for mask data preparation (MDP) is disclosed, in which a set of shots is determined that will form a pattern on a reticle, where the determination includes calculating the pattern that will be formed on a substrate using an optical lithographic process with a reticle formed using the set of shots.

A method for optical proximity correction (OPC) or mask data preparation (MDP) is also disclosed in which an inputted set of charged particle beam shots is used to calculate a reticle pattern, which is then used to calculate a substrate pattern that would be formed using an optical lithographic process with the calculated reticle pattern.

A method for optical proximity correction (OPC) or mask data preparation (MDP) is disclosed, in which a preliminary set of charged particle beam shots is generated using a preliminary mask model, and then the shots are modified by calculating both a reticle pattern using a final mask model, and a resulting substrate pattern.

A method for optical proximity correction (OPC) or mask data preparation (MDP) is disclosed, in which a previously-generated preliminary set of shots is input, and the shots are then modified by calculating a reticle pattern using a final mask model. In some embodiments a substrate pattern is also calculated using a substrate model and the calculated reticle pattern.

A method for optical proximity correction (OPC) is also disclosed, in which an ideal pattern for a photomask is calculated from a desired substrate pattern, where the model used in the calculation includes only optical lithography effects and/or substrate processing effects.

A method for optical proximity correction (OPC) is also disclosed, in which a mask model is determined to model reticle writing effects such as forward scattering, backward scattering, Coulomb effect, fogging, loading and reticle resist charging. A substrate model is subsequently determined using the mask model, whereby the mask model excludes the effects which are included in the mask model.

DETAILED DESCRIPTION OF THE EMBODIMENTS

The present disclosure is related to lithography, and more particularly to the design and manufacture of a surface which may be a reticle, a wafer, or any other surface, using charged particle beam lithography.

Figure 1:
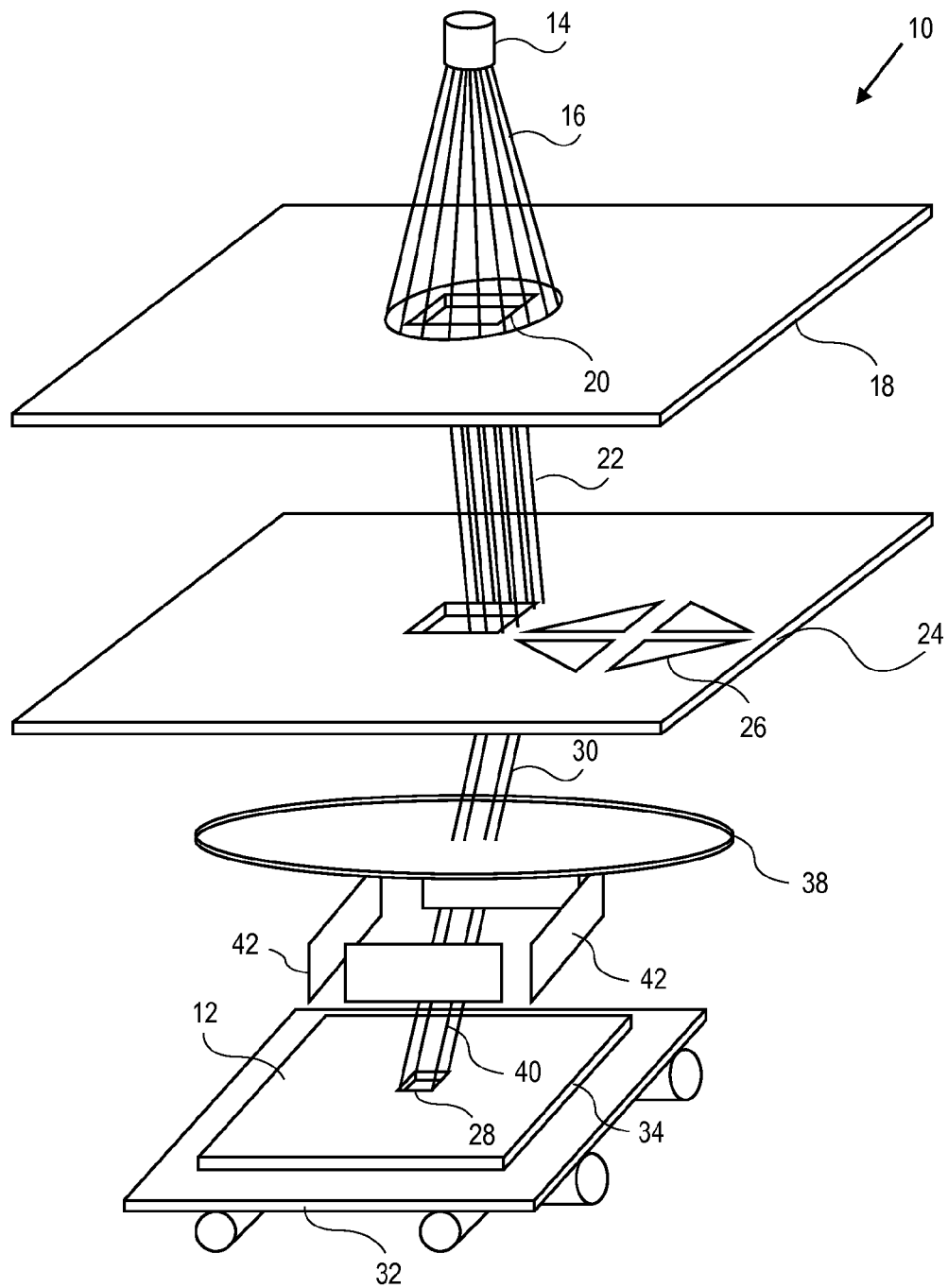
FIG. 1 illustrates an example of a variable shaped beam (VSB) charged particle beam system.

Referring now to the drawings, wherein like numbers refer to like items, FIG. 1 illustrates an embodiment of a lithography system, such as a charged particle beam writer system, in this case an electron beam writer system 10, that employs a variable shaped beam (VSB) to manufacture a surface 12. The electron beam writer system 10 has an electron beam source 14 that projects an electron beam 16 toward an aperture plate 18. The plate 18 has an aperture 20 formed therein which allows the electron beam 16 to pass. Once the electron beam 16 passes through the aperture 20 it is directed or deflected by a system of lenses (not shown) as electron beam 22 toward another rectangular aperture plate or stencil mask 24. The stencil 24 has formed therein a number of openings or apertures 26 that define various simple shapes such as rectangles and triangles. Each aperture 26 formed in the stencil 24 may be used to form a pattern in the surface 12 of a substrate 34, such as a silicon wafer, a reticle or other substrate. An electron beam 30 emerges from one of the apertures 26 and passes through an electromagnetic or electrostatic reduction lens 38, which reduces the size of the pattern emerging from the aperture 26. In commonly available charged particle beam writer systems, the reduction factor is between 10 and 60. The reduced electron beam 40 emerges from the reduction lens 38 and is directed by a series of deflectors 42 onto the surface 12 as a pattern 28. The surface 12 is coated with resist (not shown) which reacts with the electron beam 40. The electron beam 22 may be directed to overlap a variable portion of an aperture 26, affecting the size and shape of the pattern 28. Blanking plates (not shown) are used to deflect the beam 16 or the shaped beam 22 so to prevent the electron beam from reaching the surface 12 during a period after each shot when the lenses directing the beam 22 and the deflectors 42 are being re-adjusted for the succeeding shot. Typically the blanking plates are positioned so as to deflect the electron beam 16 to prevent it from illuminating aperture 20. The blanking period may be a fixed length of time, or it may vary depending, for example, on how much the deflector 42 must be re-adjusted for the position of the succeeding shot.

In electron beam writer system 10, the substrate 34 is mounted on a movable platform 32. The platform 32 allows substrate 34 to be repositioned so that patterns which are larger than the maximum deflection capability or field size of the charged particle beam 40 may be written to surface 12 in a series of subfields, where each subfield is within the capability of deflector 42 to deflect the beam 40. In one embodiment the substrate 34 may be a reticle. In this embodiment, the reticle, after being exposed with the pattern, undergoes various manufacturing steps through which it becomes a lithographic mask or photomask. The mask may then be used in an optical lithography machine to project an image of the reticle pattern 28, generally reduced in size, onto a silicon wafer to produce an integrated circuit. More generally, the mask is used in another device or machine to transfer the pattern 28 on to a substrate (not illustrated).

Although FIG. 1 illustrates a charged particle beam system in which a single beam 40 illuminates the surface 12, some charged particle beam writers can simultaneously illuminate a surface with a plurality of beams, which may or may not be independently adjustable and positionable. Multi-beam charged particle beam writers generally have higher writing speeds than single-beam writers. Some types of multi-beam writers are shaped beam, while in others the beams are scanned across the surface. For the purposes of this disclosure, the term "shot" includes exposure information for both shaped beam and scanned beam multi-beam charged particle beam writers, as well as for shaped single-beam writers.

The minimum size pattern that can be projected with reasonable accuracy onto the surface 12 is limited by a variety of short-range physical effects associated with the electron beam writer system 10 and with the surface 12, which normally comprises a resist coating on the substrate 34. These effects include forward scattering, Coulomb effect, and resist diffusion. Beam blur, also called $\beta_f$, is a term used to include all of these short-range effects. The most modern electron beam writer systems can achieve an effective beam blur radius or $\beta_f$ in the range of 20 nm to 30 nm. Forward scattering may constitute one quarter to one half of the total beam blur. Modern electron beam writer systems contain numerous mechanisms to reduce each of the constituent pieces of beam blur to a minimum. Since some components of beam blur are a function of the calibration level of a particle beam writer, the $\beta_f$ of two particle beam writers of the same design may differ. The diffusion characteristics of resists may also vary. Variation of $\beta_f$ based on shot size or shot dose can be simulated and systemically accounted for. But there are other effects that cannot or are not accounted for, and they appear as random variation.

The shot dosage of a charged particle beam writer such as an electron beam writer system is a function of the intensity of the beam source 14 and the exposure time for each shot. Typically the beam intensity remains nominally fixed, and the exposure time is varied to obtain variable shot dosages. The exposure time may be varied to compensate for various long-range effects such as back scatter, fogging and loading effects in a process called proximity effect correction (PEC). Electron beam writer systems usually allow setting an overall dosage, called a base dosage, which affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems all shots implicitly have the base dosage, before PEC. Other electron beam writer systems do allow explicit dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels. For scanned multi-beam systems, dosage adjustment may be done by scanning the surface multiple times.

Conventionally, shots are designed so as to completely cover an input pattern with rectangular shots, while avoiding shot overlap wherever possible. Also, all shots are designed to have a normal dosage, which is a dosage at which a relatively large rectangular shot, in the absence of long-range effects, will produce a pattern on the surface which is the same size as is the shot size. Some electron beam writer systems enforce this methodology by not allowing shots to overlap within an exposure pass.

Process variations can cause the width of a pattern on the photomask to vary from the intended or target width. The pattern width variation on the photomask will cause a pattern width variation on a wafer which has been exposed using the photomask in an optical lithographic process. The sensitivity of the wafer pattern width to variations in photomask pattern width is called mask edge error factor, or MEEF. In an optical lithography system using a 4× photomask, where the optical lithographic process projects a 4× reduced version of the photomask pattern onto the wafer, a MEEF of 1, for example means that for each 1 nm error in pattern width on a photomask, the pattern width on the wafer will change by 0.25 nm. A MEEF of 2 means that for a 1 nm error in photomask pattern width, the pattern width on the wafer will change by 0.5 nm. For the smallest integrated circuits processes, MEEF may be greater than 2.

Figure 2:
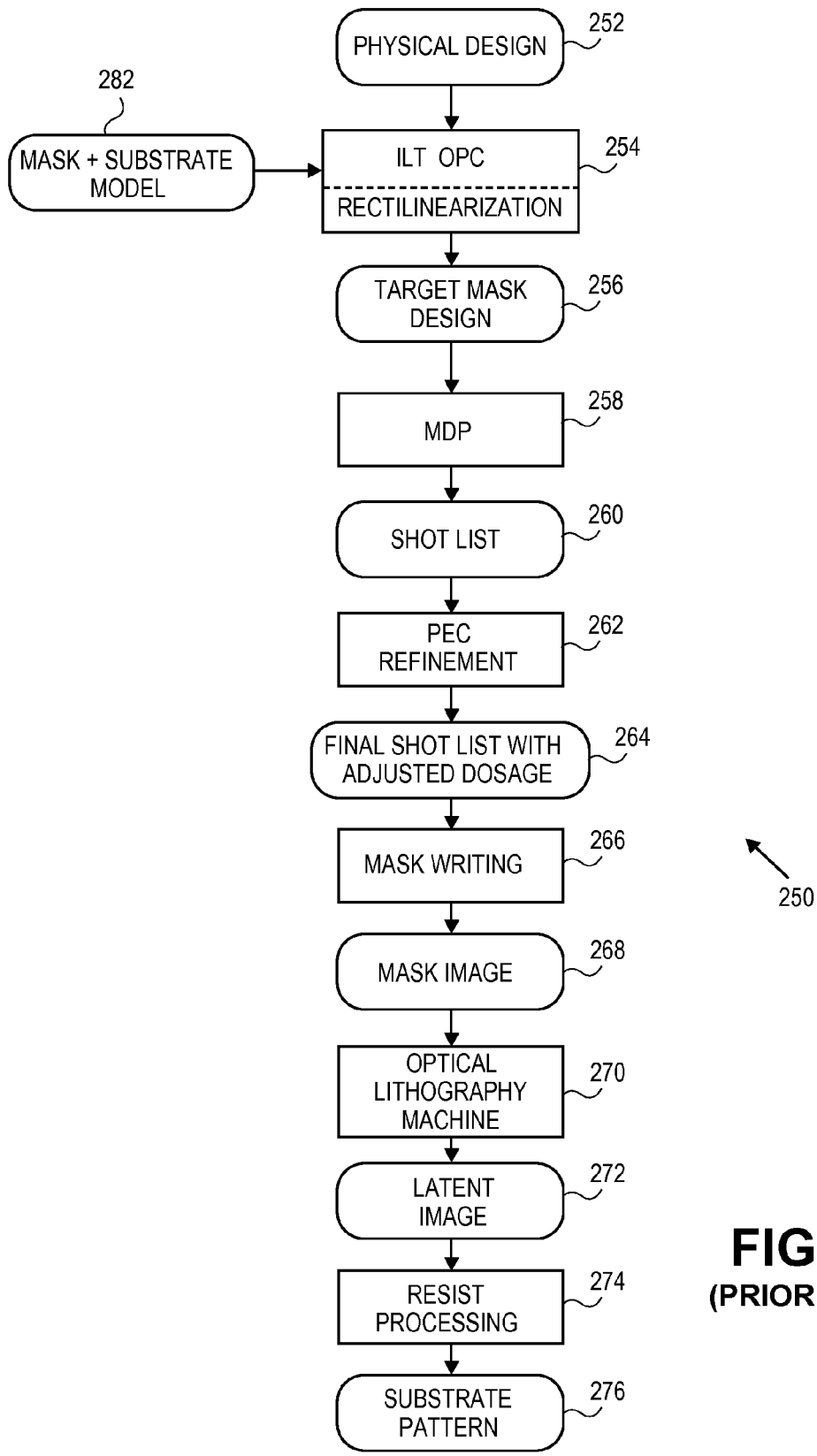
FIG. 2 illustrates a prior art conceptual flow diagram of how to prepare a surface, such as a reticle, for use in fabricating a substrate such as an integrated circuit on a silicon wafer using optical lithography.

FIG. 2 is a conceptual flow diagram of a prior art method 250 of forming patterns on a substrate such as a silicon wafer using optical lithography. In a first step 252, a physical design, such as a physical design of an integrated circuit, is created. This can include determining the logic gates, transistors, metal layers, and other items that are required to be found in a physical design of the integrated circuit. Next, in a step 254, optical proximity correction (OPC) is done on the patterns in the physical design 252 using inverse lithography technology (ILT) to create a target mask design 256. The ILT process uses mask plus substrate model 282 to guide its calculations. Although mask plus substrate model 282 is normally intended to model substrate effects, the method of determining this model may also include mask effects, as will be explained further below. Raw or "ideal" ILT-generated patterns are usually curvilinear and are therefore difficult to fracture using conventional non-overlapping VSB shots. In ILT OPC step 254 the patterns are therefore simplified to be more rectilinear in a rectilinearization sub-step of ILT OPC 254, so as to ease subsequent fracturing by VSB shots. Rectilinearization of the ILT-generated patterns reduces the accuracy of the ILT process. The resulting target mask design 256 is fractured into charged particle beam shots in mask data preparation (MDP) step 258. Conventionally, non-overlapping VSB shots are generated, either with unassigned shot dosages or where all assigned shot dosages are the same. The output of MDP 258 is a shot list 260. In a proximity effect correction (PEC) refinement step 262, shot dosages are adjusted to account for proximity effect, creating a final shot list 264. The final shot list 264 is used to generate a surface in a mask writing step 266, which uses a charged particle beam writer such as an electron beam writer system. Depending on the type of charged particle beam writer being used, PEC refinement 262 may be performed by the charged particle beam writer. Mask writing step 266 may comprise a single exposure pass or multiple exposure passes. The electron beam writer system projects one or more beams of electrons through a stencil onto a surface to form a mask image comprising patterns on the surface as shown in a step 268. After additional processing steps (not illustrated), the completed surface may then be used in an optical lithography machine, which is shown in a step 270, to expose a resist-coated substrate such as a silicon wafer to create a latent image 272 on the resist. The exposed substrate then undergoes additional resist processing steps 274, such as resist baking and resist development, to create a pattern 276 on the substrate.

In the flow of FIG. 2, the patterns comprising the wafer image 272 may differ from the physical design 252 for a variety of reasons, including:

Corner rounding. Although the patterns in physical design 252 normally have right-angle corners, those trained in the art understand that these will be rounded on the mask, and further rounded on the wafer. This rounding is due to limitations of the charged particle beam lithography and optical lithography processes, and is considered normal.

Rectilinearization of the ILT results reduces the accuracy of the resulting target mask design 256, compared to if the ideal curvilinear ILT patterns were output for target mask design 256.

Shots generated in the MDP step 258 will not exactly form the patterns in the target mask design 256, due to limitations of the fracturing process.

Limitations of conventional optical lithography. These limitations may include a relatively large MEEF, thereby causing relatively small CD errors on the mask to become more significant on the wafer.

Limitations of the mask plus substrate model 282. Bundling the mask process and substrate processes together produces inaccuracies. Additionally, the mask manufacturing process parameters vary slightly, and these variations are generally not available at the time ILT OPC 254 is being done.

In various embodiments, a considerably different flow is used. Features of this flow include:

Ideal reticle patterns are generated, such as by using ILT. Ideal ILT patterns are normally curvilinear, and are represented as polygons with non-manhattan, non-45 degree edges. Furthermore, these patterns are generated using a model which contains only optical lithography and substrate processing effects—omitting charged particle beam and reticle processing effects. Thus ILT can output a mask design pattern which is actually the ideal mask pattern for forming physical design.

A preliminary set of generated charged particle beam shots is OPC-optimized, so as to improve the quality of the substrate pattern. To do this, double simulation is used:

A reticle pattern is calculated, such as by using charged particle beam simulation. A higher-accuracy mask model is used for this optimization step than was used to generate the preliminary set of shots.

A substrate pattern is calculated, such as by using lithography simulation, using the calculated reticle pattern as input.

This is explained more fully in the following paragraphs.

Figure 3:
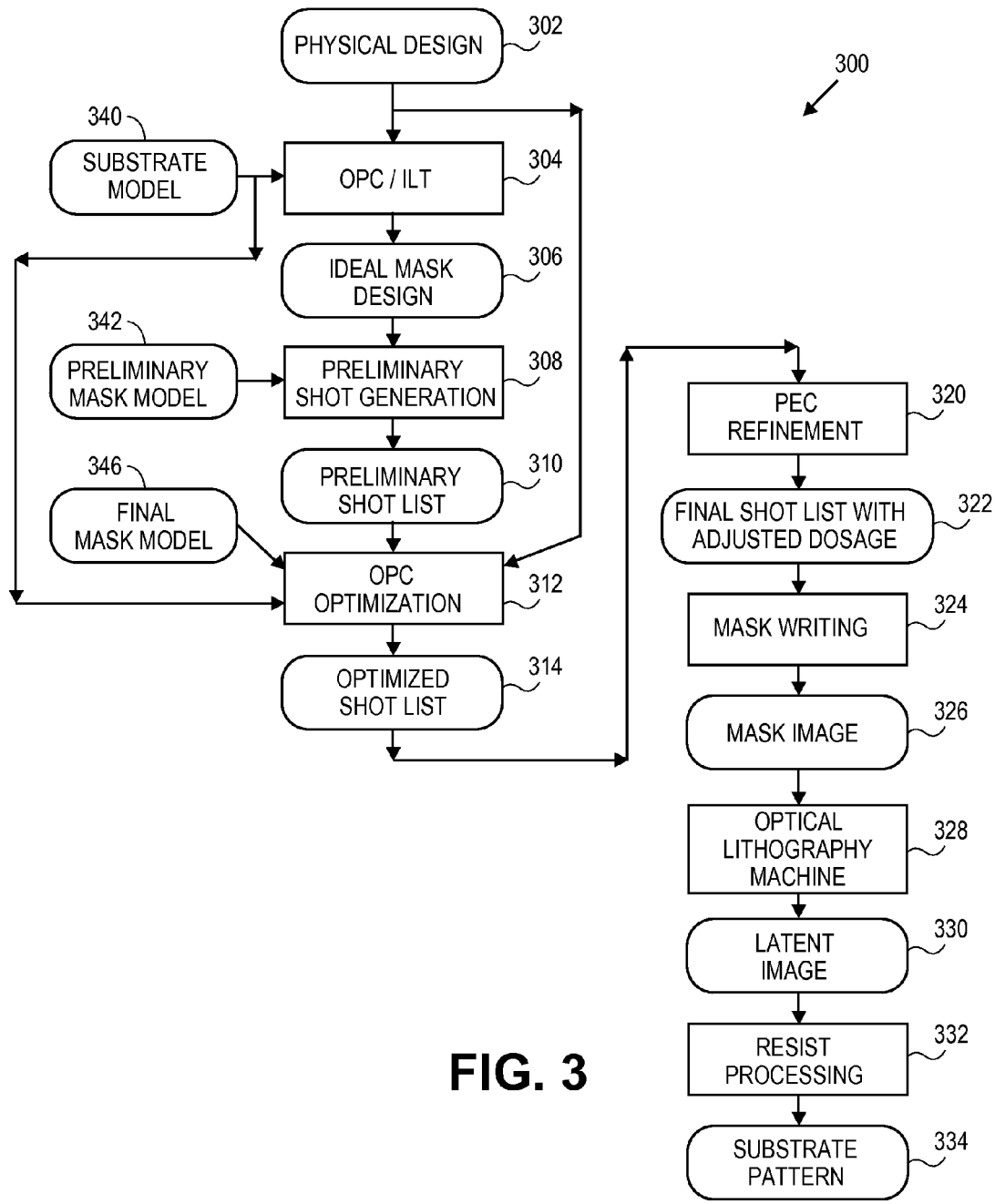
FIG. 3 illustrates a conceptual flow diagram of an exemplary method of how to prepare a surface, such as a reticle, for use in fabricating a substrate such as an integrated circuit on a silicon wafer using optical lithography.
Figure 10:
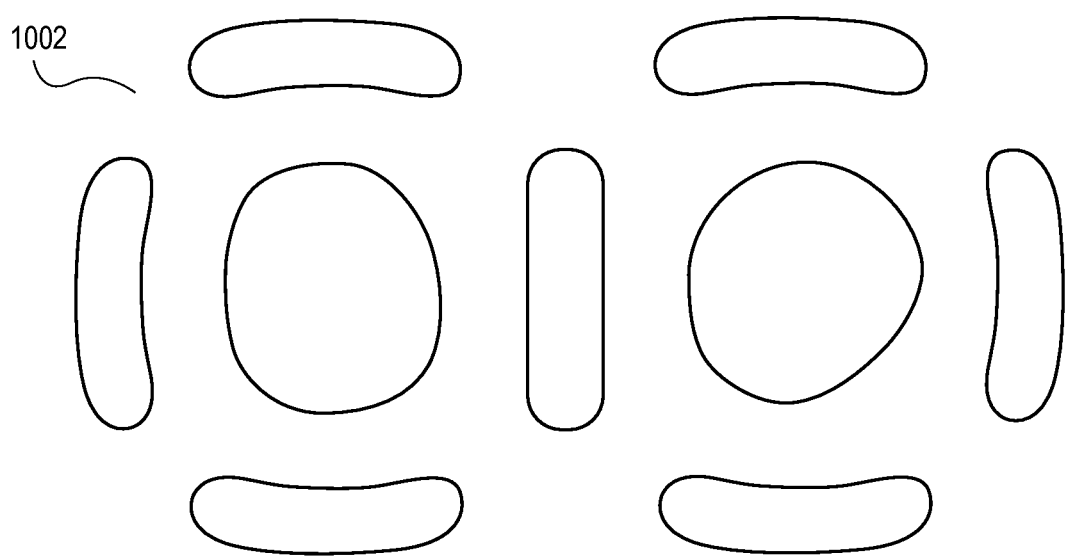
FIG. 10 illustrates complex patterns such as those which may be output by processing using inverse lithography technology (ILT).

FIG. 3 is a conceptual flow diagram 300 for forming patterns on a substrate such as a silicon wafer using optical lithography, according to one embodiment of the current disclosure. In a first step 302, a physical design, such as a physical design of an integrated circuit, is created. This can include determining the logic gates, transistors, metal layers, and other items that are required to be found in a physical design such as the physical design of an integrated circuit. Next, in a step 304, optical proximity correction (OPC) is done on the patterns in the physical design 302 or on a portion of the patterns in the physical design to create an ideal mask design 306. In some embodiments ILT is used in OPC step 304. The OPC/ILT process does not use rectilinearization as in the flow 252, but rather creates ideal patterns in ideal mask design 306. The pattern in ideal mask design 306 may be, for example, a complex shape represented using polygons with non-manhattan, non-45 degree edges. Such patterns are illustrated in FIG. 10, which shows exemplary complex shapes 1002 that may be represented using polygons with non-manhattan, non-45 degree edges. The OPC/ILT step 304 in FIG. 3 uses a substrate model 340 which incorporates optical lithography and substrate processing effects, but which does not incorporate charged particle beam exposure and reticle processing effects. Compared to target mask design 256 of flow 250, ideal mask design 306 is closer to the ideal pattern for the reticle. In step 308, the ideal mask design is fractured into a preliminary set of charged particle beam shots 310. Preliminary shot generation 308 may use a relatively simple preliminary mask model 342, such as a single Gaussian. Preliminary shot list 310 is capable of forming a preliminary pattern on the reticle that approximates the desired pattern for the reticle. In one embodiment, the preliminary shot list 310 may have a target accuracy of, for example, 4 nm on the mask, compared to the ideal mask design 306. In another embodiment, the target shot count may be within, for example, 2% of the final yet-undetermined shot count.

In step 312, OPC optimization is performed. OPC optimization inputs both the preliminary shot list 310 and the physical design 302. OPC optimization 312 uses two simulation sub-steps, which shall be defined as "double-simulation" in this disclosure. A final mask model 346 and the substrate model 340 are used by the two simulation sub-steps in OPC optimization 312. The details of OPC optimization 312 are described in more detail in FIG. 4 and associated description below. In some embodiments the final mask model 346 and the preliminary mask model 342 may be the same. In some embodiments, OPC optimization 312 may reduce shot count. The output of OPC optimization 312 is optimized shot list 314. In one embodiment, the target shot count of optimized shot list 314 may be within 1% of the final shot count. In another embodiment, the optimized shot list may have a target accuracy of 1 nm on the wafer.

In a proximity effect correction (PEC) refinement step 320, shot dosages of the shots in the optimized shot list 314 are adjusted to account for long-range effects, which may include back scattering, loading, fogging, and resist charging. The output of PEC refinement 320 is a final shot list with adjusted dosages 322. The final shot list with adjusted dosages 322 is used to generate a reticle in a mask writing step 324, which uses a charged particle beam writer such as an electron beam writer system. Depending on the type of charged particle beam writer being used, PEC refinement 320 may be performed by the charged particle beam writer. Mask writing step 324 may comprise a single exposure pass or multiple exposure passes. The electron beam writer system projects one or more beams of electrons through a stencil onto a reticle to form a mask image comprising patterns on the reticle as shown in a step 326. After various processing steps (not illustrated), the completed reticle may then be used in an optical lithography machine, which is shown in a step 328, to expose a resist-coated substrate such as a silicon wafer to create a latent image 330 on the resist. The exposed substrate then undergoes additional resist processing steps 332, such as resist baking and resist development, to create a pattern 334 on the substrate.

Figure 4:
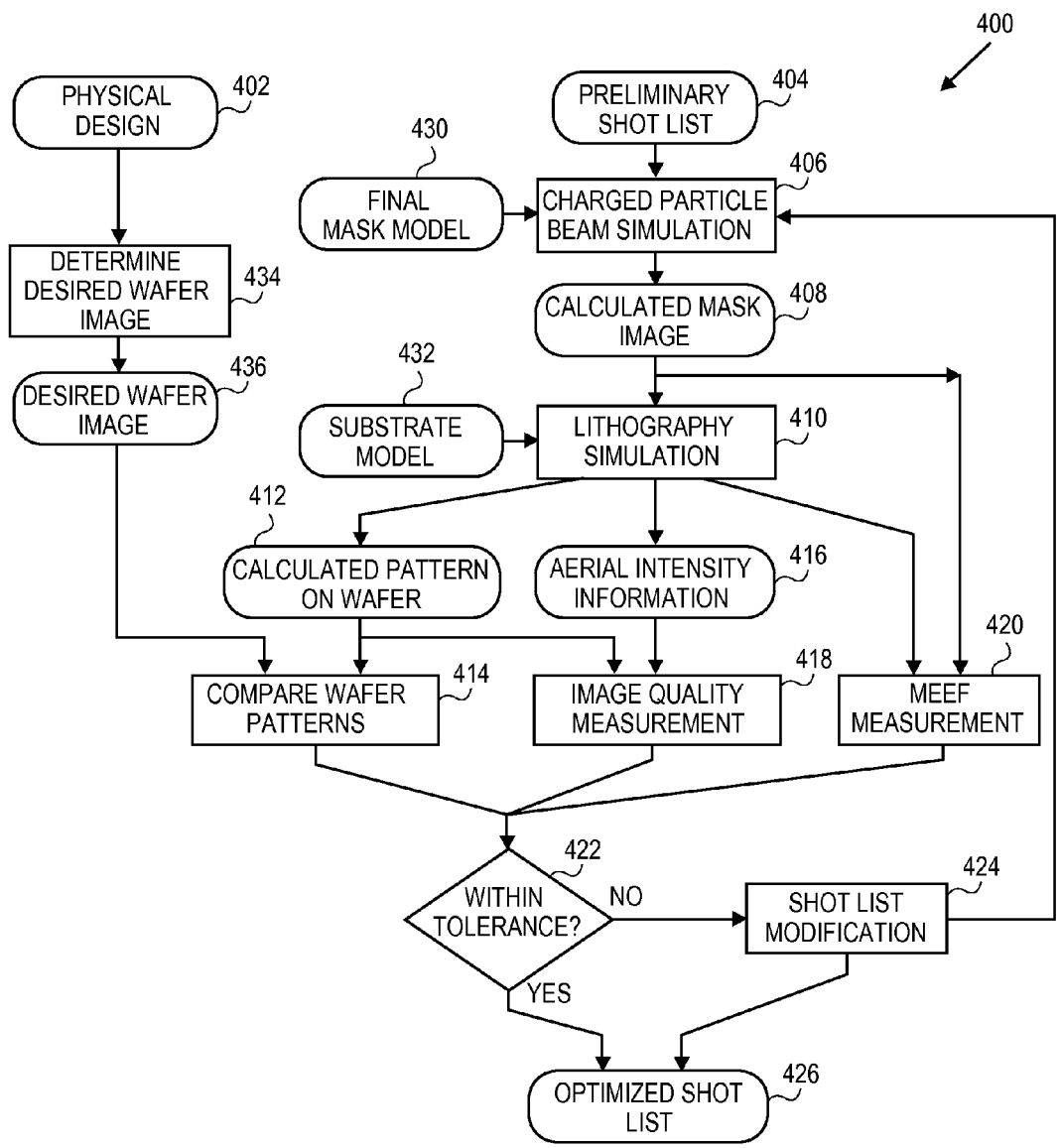
FIG. 4 illustrates an exemplary conceptual flow diagram detailing OPC optimization from FIG. 3.

FIG. 4 is a conceptual flow diagram 400 which illustrates details of one embodiment of OPC optimization step 312. One input to process 400 is the physical design 402, which corresponds to FIG. 3 physical design 302. In step 434 the physical design 402 is processed to determine a desired wafer image 436. In one embodiment, this processing comprises rounding the corners—both inside and outside corners—in the physical design patterns. In other embodiments, other processing may be done in step 434 on the patterns in physical design 402. In yet other embodiments, the physical design 402 is itself used as the desired wafer image 436. Another input to process 400 is preliminary shot list 404, which corresponds to FIG. 3 preliminary shot list 310. In step 406, charged particle beam simulation calculates a calculated mask image 408. The charged particle beam simulation 406 uses a final mask model 430, which corresponds to FIG. 3 final mask model 346. The output of charged particle beam simulation 406 is calculated mask image 408. Lithography simulation 410 then calculates a calculated pattern on a wafer 412, which is the aerial image or pattern that will be imaged on a resist-coated wafer with an optical lithographic process using a reticle or photomask containing calculated mask image 408. Lithography simulation 410 uses substrate model 432, which corresponds to FIG. 3 substrate model 340. Lithography simulation 410 may also output aerial intensity information 416 of the calculated aerial image on the substrate resist. In one embodiment, in step 414, the calculated pattern on the wafer 412 may be compared with the desired wafer image 436, to determine if the calculated wafer pattern 412 and the desired wafer image 436 are within a pre-determined tolerance of each other. In other embodiments, image quality measurements 418 may be made on the calculated wafer pattern 412 and/or the aerial intensity information 416. Parameters that may be measured in image quality measurement step 418 include critical dimension (CD), critical dimension uniformity (CDU), depth of focus (DOF), exposure latitude (EL) and process variation (PV) band. In another embodiment the mask error enhancement factor (MEEF) may be calculated in step 420 using the calculated mask image 408 and output from lithography simulation 410. Some measurements may require that charged particle beam simulation 406 and/or lithography simulation 410 be run for more than one manufacturing condition, such as to measure the effect of process variations. The different manufacturing conditions may be reflected as different variations of final mask model 430 and substrate model 432. Similarly, some measurements may require that charged particle beam simulation 406 be run for more than one manufacturing condition as determined by final mask model 430. Wafer pattern comparison 414, image quality measurement 418 and/or MEEF measurement 420 communicate to a conditional step 422, which determines if the shots that were simulated are within the desired tolerance(s). If the shots are not within the desired tolerances, the shot list is modified in a step 424 such that the pattern formed by the modified set of shots more closely approximates the desired substrate pattern. The shot list which is modified in step 424 may be the preliminary shots or may be derived from the preliminary set of shots. Shot modification 424 may comprise, for example, changing the location, or shape or dose of an existing shot. Shot modification 424 may also comprise deleting shots and adding shots. In some embodiments, the required shot modifications may be calculated directly, so that the result of shot list modification 424 is an optimized shot list 426. In other embodiments, shot list modification 424 may be iterative, in which case shot list modification 424 outputs a revised set of shots back to charged particle beam simulation 406. The tolerance used in conditional step 422 may change due to changes in processing of the photomask or the substrate. Eventually, conditional step 422 determines that the desired tolerances have been reached, so that the current shot list is output as the optimized shot list 426. In one embodiment, the target shot count of the optimized shot list 426 may be within 1% of the final shot count.

Figure 5:
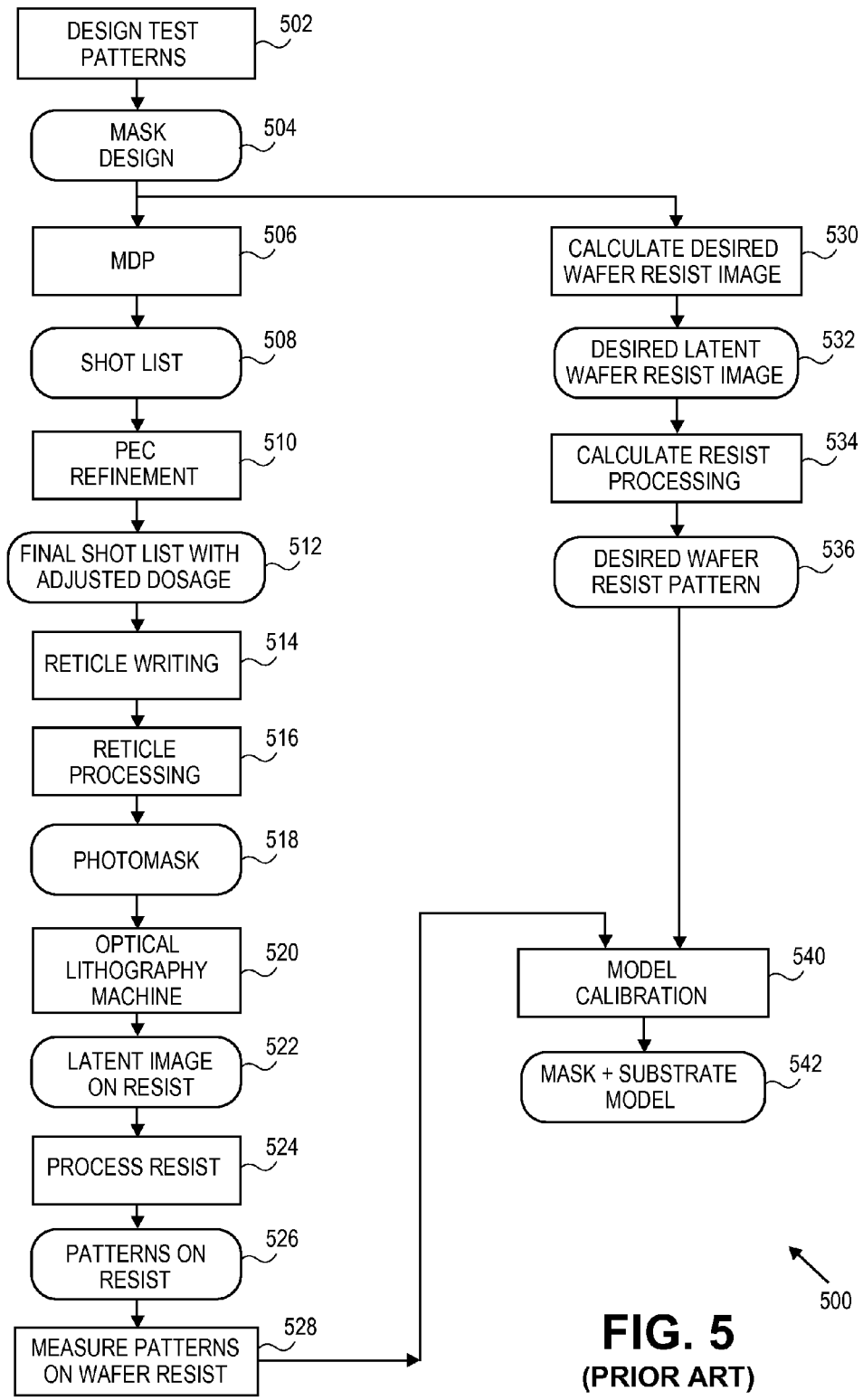
FIG. 5 illustrates a prior art method for creating a calibrated model for the prior art design flow of FIG. 2.

FIG. 5 illustrates a conceptual flow diagram 500 of a prior art method for creating a mask plus substrate model such as the mask plus substrate model 282 in FIG. 2 flow 250. In the first step 502 specialized test patterns are designed. The output of step 502 is a mask design 504. The resulting mask design 504 is fractured into charged particle beam shots in mask data preparation (MDP) step 506. Conventionally, non-overlapping VSB shots are generated in MDP step 506, either with unassigned shot dosages or where all assigned shot dosages are the same. The output of MDP 506 is a shot list 508. In a proximity effect correction (PEC) refinement step 510, shot dosages of the shots in the shot list 508 are adjusted to account for long-range effects, which may include back scattering, loading, fogging, and resist charging. The output of PEC refinement 510 is a final shot list with adjusted dosages 512. The final shot list 512 is used to generate a surface in a reticle writing step 514, which uses a charged particle beam writer such as an electron beam writer system. Depending on the type of charged particle beam writer being used, PEC refinement 510 may be performed by the charged particle beam writer. Reticle writing step 514 may comprise a single exposure pass or multiple exposure passes. The electron beam writer system projects one or more beams of electrons through a stencil onto a surface to form an image on the reticle. The reticle containing the image then undergoes various reticle processing steps 516 through which it becomes a photomask 518. The photomask 518 is used in an optical lithography machine 520 to form a latent image on a resist-coated substrate such as a silicon wafer. The resist-coated surface containing the latent image 522 is then processed in step 524, such as by baking and developing, to form patterns on the resist 526. In step 528, various measurements are made on the patterns on the processed resist coating on the substrate. These measurements are one of the inputs to model calibration step 540.

Mask design 504 is also input to a step 530 which calculates a desired wafer image on the resist. Step 530 may comprise rounding of the corners, such as 90 degree corners, on the mask design patterns. Step 530 may also comprise fast 3-dimensional near field image calculation. The result of step 530 is a desired latent wafer resist image 532. In step 534, the effects of resist processing steps are calculated on the patterns of the desired latent resist image 532 to create a desired wafer resist pattern 536. The desired wafer resist pattern 536 is one of the inputs to model calibration step 540.

Model calibration step 540 uses the test pattern measurements 528 and the desired wafer resist pattern 536 to create a mask plus substrate model 542. As can be seen from flow 500, the processes that have been modeled include charged particle beam reticle exposure and mask processing, and also the transfer of the mask pattern to the resist-coated substrate using optical lithography to create a latent image. By contrast, the resist processing step 524 is not included in mask plus substrate model 542 because its effects are pre-calculated in step 534. The mask plus substrate model 542 corresponds to mask plus substrate model 282 in prior art flow 250.

The prior art success of mask plus substrate mode 542 is due to the mask-making part of the process being relatively well-behaved, so that providing a similar dosage to all shapes before PEC can produce a predictable shape on a mask. For mask patterns smaller than 100 nm, however, the charged particle beam exposure process is not so well-behaved that a similar dosage to all pattern shapes will produce a predictable pattern on the reticle. Additionally, when MB-MDP is used, which intentionally creates varying dosages on the reticle, reticle/mask manufacturing effects—including charged particle beam simulation—must be separated from substrate manufacturing effects such as optical lithography to allow accurate simulation of either mask or substrate effects.

In prior art flow 250, inclusion of mask manufacturing effects with optical lithography and substrate resist effects works best when the charged particle beam exposure process can provide a constant dosage, before PEC refinement 262, to all parts of the target mask design 256.

Figure 6:
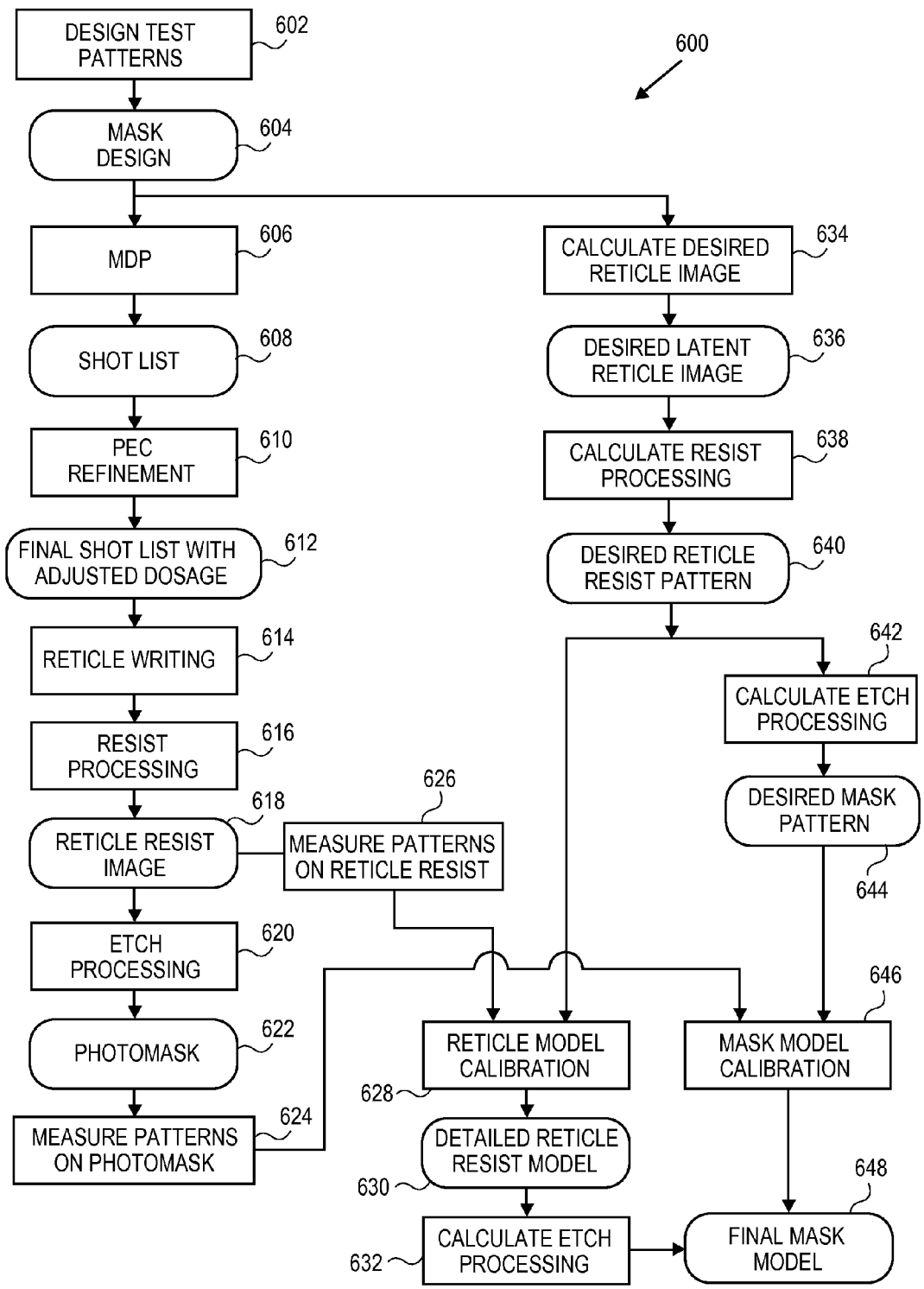
FIG. 6 illustrates a conceptual flow diagram of an exemplary method of creating a mask model.

FIG. 6 is a conceptual flow diagram 600 for creation of the final mask model 346 of flow 300. In step 602 test patterns are designed, to create a mask design 604. The resulting mask design 604 is fractured into charged particle beam shots in MDP step 606. Shots may have assigned or unassigned shot dosages. The output of MDP is a shot list 608. In a proximity effect correction (PEC) refinement step 610, shot dosages of the shots in the shot list 608 are adjusted to account for long-range effects, which may include back scattering, loading, fogging, and resist charging. The output of PEC refinement 610 is a final shot list with adjusted dosages 612. The final shot list 612 is used to generate a surface in a reticle writing step 614, which uses a charged particle beam writer such as an electron beam writer system. Depending on the type of charged particle beam writer being used, PEC refinement 610 may be performed by the charged particle beam writer. Reticle writing step 614 may comprise a single exposure pass or multiple exposure passes. The electron beam writer system projects one or more beams of electrons through a stencil onto a resist-coated reticle surface to form a latent image on the reticle resist. Resist processing step 616 converts the latent image on the resist into a resist image 618. The reticle containing the image then undergoes etch processing steps 620 and possibly other processing steps through which it becomes a photomask 622.

In a first embodiment, patterns on the reticle resist image 618 may be measured in step 626 and these measurements used in a reticle model calibration step 628. In a second embodiment, patterns on the completed photomask 622 are measured in a step 624, and the measurement results used in a mask model calibration step 646.

Mask design 604 is also input to a step 634 which calculates a desired aerial image on the reticle. The result of step 634 is a desired latent reticle image 636. In step 638, the effects of reticle resist processing is calculated on the patterns of the desired latent reticle image 636 to create a desired reticle resist pattern 640. In the first embodiment described in the previous paragraph, the desired reticle resist pattern 640 is one of the inputs to model calibration step 628. In the second embodiment of the previous paragraph, the results of etch processing are calculated in step 642 to create a desired mask pattern 644, which becomes input to model calibration step 646.

In the first embodiment, reticle model calibration step 628 creates a detailed reticle resist model 630. An etch calculation step 632 calculates the effects of etching to create a final mask model 648. Etch calculation may be a simple bias, or may be a more complex calculation. In the second embodiment, since both inputs for mask model calibration step 646 already include reticle etch effects, mask model calibration 646 creates the final mask model 648 directly. Final mask model 648 corresponds to final mask model 346 in FIG. 3 flow 300. Physical phenomena that may be included in final mask model 346 include forward scattering, backward scattering, Coulomb effect, fogging, resist charging, loading, resist bake, resist development, and resist etch.

The preliminary mask model 342 of flow 300 can be created with a flow similar to flow 600. In creating the simple mask model, the model may be constrained to be simpler and faster to compute than final mask model 346. In one embodiment, preliminary mask model 342 is a single Gaussian.

Figure 7:
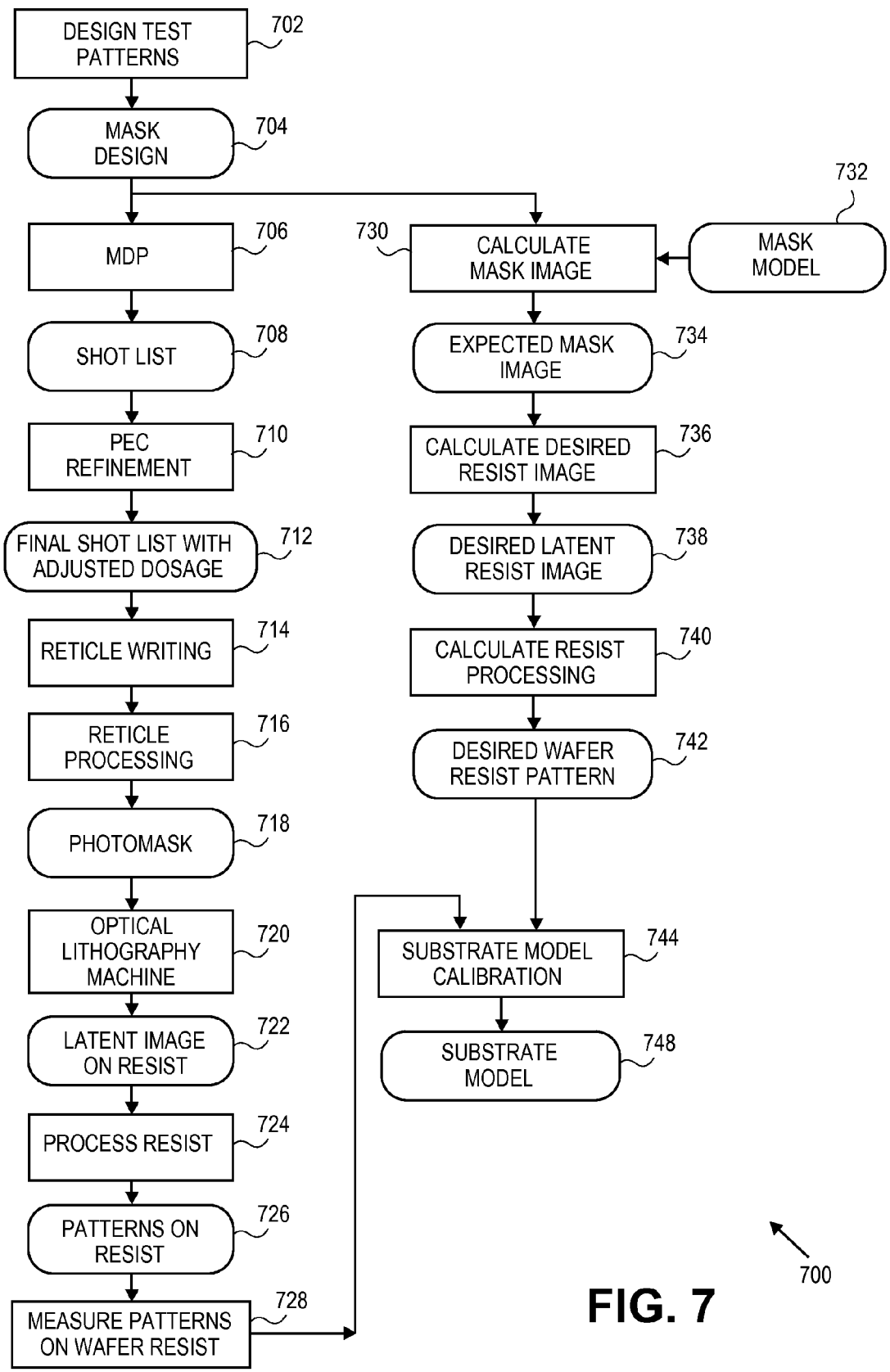
FIG. 7 illustrates a conceptual flow diagram of an exemplary method of creating a substrate model.

FIG. 7 is a conceptual flow diagram illustrating a flow 700 for creating a substrate model according to another embodiment. In a first step 702 test patterns are designed. These patterns comprise shapes which, after mask fabrication and transfer to a resist-coated substrate with optical lithography, will be measured. The output of step 702 is a mask design 704. The resulting mask design 704 is fractured into charged particle beam shots in MDP step 706. Shots may have assigned or unassigned dosages. The output of MDP 706 is a shot list 708. In a proximity effect correction (PEC) refinement step 710, shot dosages of the shots in the shot list 708 are adjusted to account for long-range effects, which may include back scattering, loading, fogging, and resist charging. The output of PEC refinement 710 is a final shot list with adjusted dosages 712. The final shot list 712 is used to generate a surface in a reticle writing step 714, which uses a charged particle beam writer such as an electron beam writer system. Depending on the type of charged particle beam writer being used, PEC refinement 710 may be performed by the charged particle beam writer. Reticle writing step 714 may comprise a single exposure pass or multiple exposure passes. The electron beam writer system projects one or more beams of electrons through a stencil onto a surface to form an image on the reticle. The reticle containing the image then undergoes various processing steps 716 through which it becomes a photomask 718. The photomask 718 is used in an optical lithography machine 720 to form a latent image on a resist-coated substrate such as a silicon wafer. The resist-coated surface containing the latent image 722 is then processed in step 724, such as by baking and developing, to form patterns on the resist 726. In step 728, various measurements are made on the patterns on the processed resist coating on the substrate. These measurements are one of the inputs to substrate model calibration step 744.

Mask design 704 is also input to a step 730 which calculates an expected mask image, such as by using charged particle beam simulation. The calculation uses a previously-determined mask model 732, which in one embodiment corresponds to final mask model 648 in flow 600. The output of step 730 is an expected mask image 734. In step 736 the expected mask image is used to calculate a desired image on the resist. Step 736 may comprise rounding of the corners, such as 90 degree corners, on the mask design patterns. Step 736 may also comprise fast 3-dimensional near field image calculation. The result of step 736 is a desired latent resist image 738. In step 740, the effects of resist processing steps are calculated on the patterns of the desired latent resist image 738 to create a desired wafer resist pattern 742. The desired wafer resist pattern 742 is one of the inputs to substrate model calibration step 744.

Substrate model calibration step 744 uses the test pattern measurements 728 and the desired wafer pattern 742 to create a substrate model 748. The substrate model 748 corresponds to substrate model 340 in flow 300. Compared to the prior art flow 500 which produces a mask plus substrate model, the desired wafer resist pattern 742 is calculated from expected mask image 734. In flow 500 the desired wafer resist pattern 536 is calculated from mask design 504 directly. The addition of step 730 to flow 700, which requires pre-calculated mask model 732, allows creation of substrate model 748 which does not contain mask effects such as forward scattering, backward scattering and Coulomb effect. Stated another way, by including the calculated mask effects into desired wafer resist pattern 742, the substrate model calibration step 744 sees mask effects on both of its data sources—wafer resist measurements 728 and desired wafer resist pattern 742. To the extent that the mask model 732 is accurate, the modeled mask effects included in the desired wafer resist pattern 742 will equal the actual mask effects from reticle writing 714 and reticle processing 716 which are included in the wafer resist measurements 728, so that mask effects are essentially subtracted from the wafer resist measurements 728 during model calibration step 744, resulting in a substrate model 748 that does not account for and is not influenced by mask effects.

Referring again to FIG. 3 exemplary flow 300, by having available a substrate model 340 which does not include mask effects, ideal ILT step 304 is then able to compute an ideal mask design 306. The preliminary shot generation 308 step uses preliminary mask model 342 for shot generation. Therefore, inclusion of mask effects into the model used for ideal ILT 304, as would occur in the prior art flow 250 mask plus substrate model 282, would incorrectly double-compensate for mask effects. By comparison, in prior art flow 250 the target mask design 256, which is the output of ILT OPC 254, contains compensation for mask effects because the mask plus substrate model 282 includes mask effects, including charged particle beam effects, as well as optical lithography and wafer effects.

Figure 8:
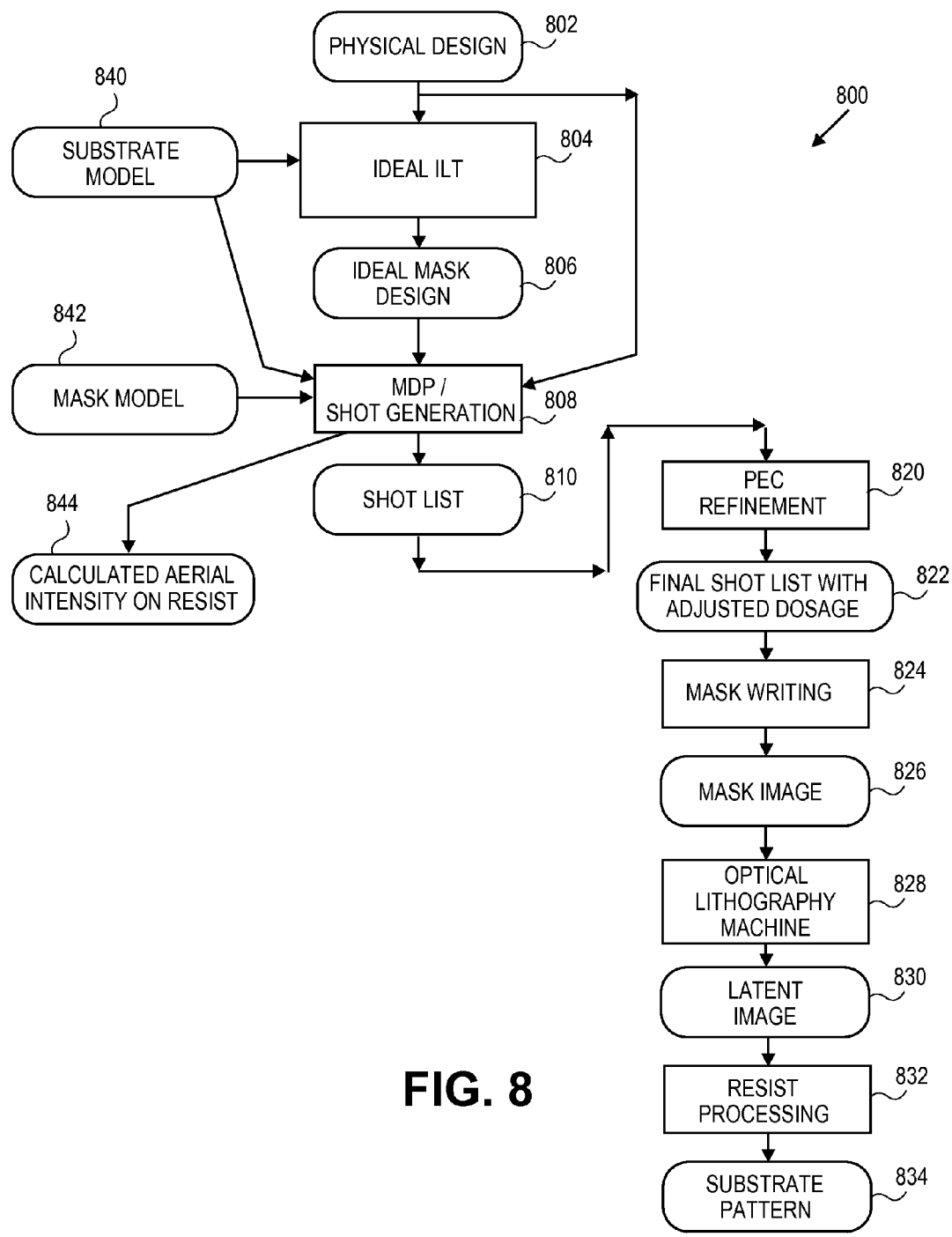
FIG. 8 illustrates a conceptual flow diagram of another exemplary method of how to prepare a surface, such as a reticle, for use in fabricating a substrate such as an integrated circuit on a silicon wafer using optical lithography.

FIG. 8 is a conceptual flow diagram 800 for forming patterns on substrates such as a silicon wafer using optical lithography, according to another embodiment of the current disclosure. In a first step 802, a physical design, such as a physical design of an integrated circuit, is created. This can include determining the logic gates, transistors, metal layers, and other items that are required to be found in a physical design such as the physical design of an integrated circuit. Next, in a step 804, OPC is done on the patterns in the physical design 802 or on a portion of the patterns in the physical design 802 using ILT to create an ideal mask design 806. The OPC/ILT process does not use rectilinearization as in step 254 of the flow 250, but rather creates ideal—and typically curvilinear—patterns in ideal mask design 806. The ideal ILT step 804 uses a substrate model 840 which incorporates lithography and substrate processing effects, but which does not incorporate charged particle beam exposure and reticle processing effects as in the flow 250. Substrate processing effects may include, for example, substrate resist bake and substrate resist development. Therefore, ideal mask design 806 is actually a computed target pattern for the mask.

In MDP step 808, the ideal mask design 806 is fractured into a set of charged particle beam shots 810. MDP step 808 uses double simulation to determine the pattern that will be formed on the substrate with a set of shots. Double simulation is a two-part procedure. In the first part, a mask model 842 is used to calculate a pattern that will be produced on a reticle with the set of shots. In the second part, substrate model 840 is used to calculate a pattern that will be formed on the substrate using the calculated reticle pattern. Charged particle beam simulation may be used to calculate the reticle pattern using the mask model. Lithography simulation may be used to calculate the substrate pattern using the substrate model. The substrate model 840 may include optical lithography effects, and may also include resist effects such as resist bake and resist development. MDP 808 includes comparison of the calculated reticle pattern with the physical design 802, and may include optimization of the CD of the substrate pattern, critical dimension uniformity (CDU) of the substrate pattern, depth of focus (DOF) of the substrate pattern, exposure latitude of the substrate pattern, process variation (PV) band of the reticle pattern or mask error enhancement factor (MEEF) of the reticle pattern. MDP 808 outputs shot list 810. MDP 808 may also output calculated aerial intensity information 844 for the substrate resist pattern, either for part of the pattern or for the entire pattern.

In a proximity effect correction (PEC) refinement step 820, shot dosages of the shots in the shot list 810 are adjusted to account for long-range effects, which may include back scattering, loading, fogging, and resist charging. The output of PEC refinement 820 is a final shot list with adjusted dosages 822. The final shot list with adjusted dosages 822 is used to generate a surface in a mask writing step 824, which uses a charged particle beam writer such as an electron beam writer system. Depending on the type of charged particle beam writer being used, PEC refinement 820 may be performed by the charged particle beam writer. Mask writing step 824 may comprise a single exposure pass or multiple exposure passes. The electron beam writer system projects one or more beams of electrons through a stencil onto a surface to form a mask image comprising patterns on the surface as shown in a step 826. After additional processing steps (not illustrated), the completed surface may then be used in an optical lithography machine, which is shown in a step 828, to expose a resist-coated substrate such as a silicon wafer to create a latent image 830 on the resist. The exposed substrate then undergoes additional resist processing steps 832, such as resist baking and resist development, to create a pattern 834 on the substrate.

Figure 9:
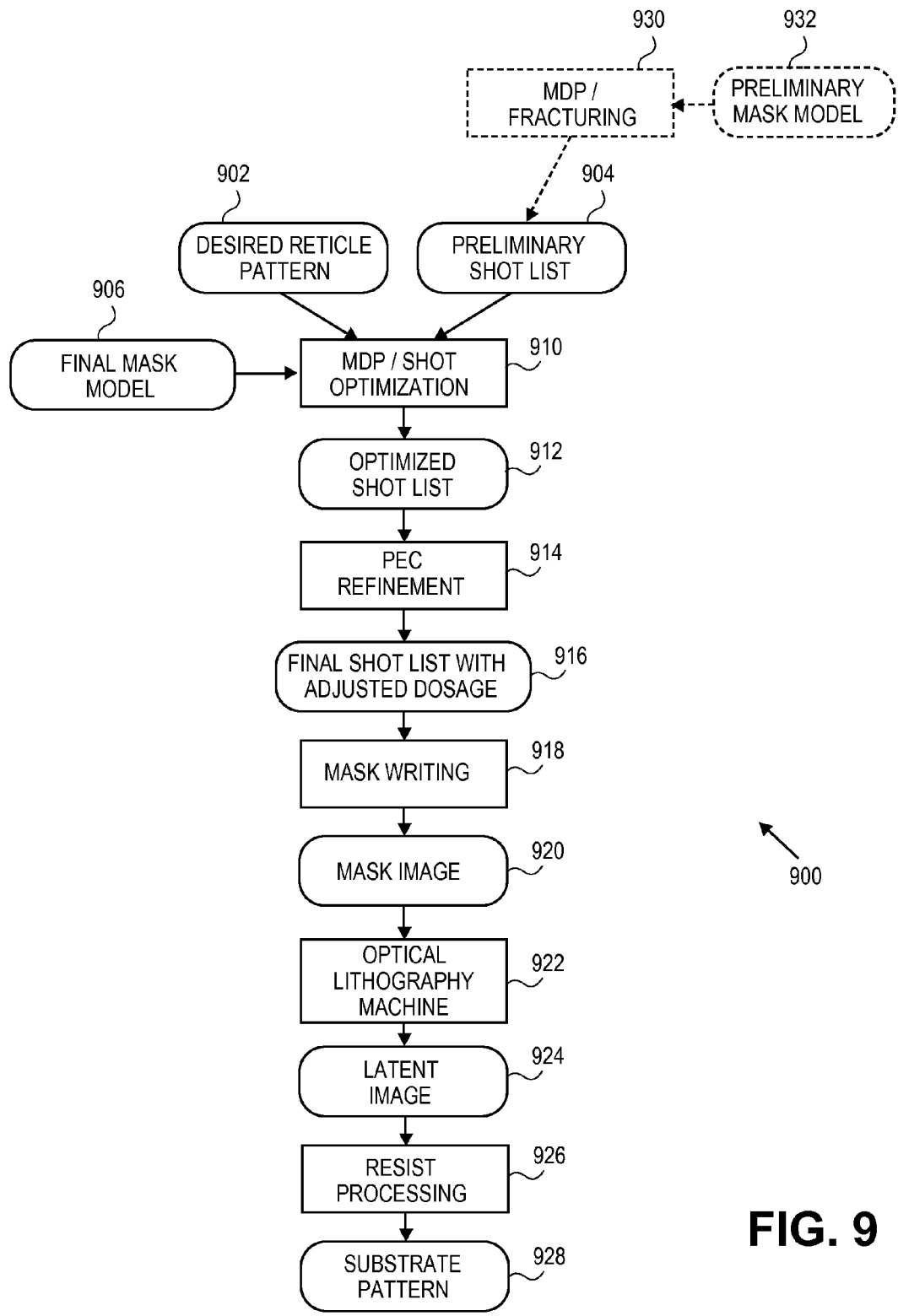
FIG. 9 illustrates a conceptual flow diagram of a method for optimizing a pre-existing shot list.

FIG. 9 is a conceptual flow diagram 900 for optimizing a pre-existing shot list. Flow 900 begins with a desired reticle pattern 902 and a preliminary shot list 904, where the preliminary shot list 904 is capable of approximately forming the desired reticle pattern 902. In some embodiments, preliminary shot list 904 will have previously been created in an MDP/fracturing step 930 using a preliminary mask model 932, such as a single Gaussian model. MDP step 910 modifies shots in original charged particle beam shot list 904, to create a resulting optimized shot list 912 that is capable of forming a desired reticle pattern 902 more accurately than the original shot list 904. Shots in the optimized shot list 912 may overlap, and may have different assigned dosages. MDP step 910 calculates a reticle pattern from the original and/or modified shot lists, using a final mask model 906. In a proximity effect correction (PEC) refinement step 914, shot dosages of the shots in the optimized shot list 912 are adjusted to account for long-range effects, which may include back scattering, loading, fogging, resist charging and other long-range effects. The output of PEC refinement 914 is a final shot list 916. The final shot list 916 is used to generate a surface in a mask writing step 918, which uses a charged particle beam writer such as an electron beam writer system. Depending on the type of charged particle beam writer being used, PEC refinement 914 may be performed by the charged particle beam writer. Mask writing step 918 may comprise a single exposure pass or multiple exposure passes. The electron beam writer system projects one or more beams of electrons onto a surface to form a mask image comprising patterns on the surface as shown in a step 920. After further processing steps (not illustrated), the completed surface may then be used in an optical lithography machine, which is shown in a step 922, to expose a resist-coated substrate such as a silicon wafer to create a latent image 924 on the resist. The exposed substrate then undergoes additional resist processing steps 926, such as resist baking and resist development, to create a pattern 928 on the substrate. Flow 900 may be useful when, for example, the mask process has changed since the preliminary shot list 904 was created, causing a mask model change, which requires re-optimization of the shots in the preliminary shot list 904 using final mask model 906 which corresponds to the revised mask process. The mask process change may, for example, be a mask process bias change.

Some embodiments of the flows described herein may use complex character projection (CP) characters during MDP/shot generation. In particular, circular CP characters can be used.

The various embodiments set forth in this disclosure may be employed on a portion of a physical design. In one embodiment, a complete desired pattern for a reticle is input, and a previously-determined set of shots is also input. A reticle pattern is calculated using the set of previously-determined shots, and then the calculated reticle pattern is compared with the desired pattern for the reticle. For areas where the difference between the calculated reticle pattern and the desired reticle pattern exceed a pre-determined threshold, such as, for example, 2 nm, shots are regenerated using the flow 300 or the flow 800. In another embodiment, for areas where the difference between the calculated reticle pattern and the desired reticle pattern exceed a pre-determined threshold, the existing shots in those areas are optimized with flow 900.

The calculations described or referred to herein may be accomplished in various ways. Generally, calculations may be accomplished by in-process, pre-process or post-process methods. In-process calculation involves performing a calculation at the time when its results are needed. Pre-process calculation involves pre-calculating and then storing results for later retrieval during a subsequent processing step, and may improve processing performance, particularly for calculations that may be repeated many times. Calculations may also be deferred from a processing step and then done in a later post-processing step. An example of pre-process calculation is pre-calculating a pattern formed by two overlapping shots in the vicinity of the shot overlap. Another example of pre-process calculation is a shot group, which is a pre-calculation of dosage pattern information for one or more shots associated with a given input pattern or set of input pattern characteristics. The shot group and the associated input pattern may be saved in a library of pre-calculated shot groups, so that the set of shots comprising the shot group can be quickly generated for additional instances of the input pattern, without pattern re-calculation. In some embodiments, the pre-calculation may comprise simulation of the dosage pattern that the shot group will produce on a resist-coated surface. In other embodiments, the shot group may be determined without simulation, such as by using correct-by-construction techniques. In some embodiments, the pre-calculated shot groups may be stored in the shot group library in the form of a list of shots. In other embodiments, the pre-calculated shot groups may be stored in the form of computer code that can generate shots for a specific type or types of input patterns. In yet other embodiments, a plurality of pre-calculated shot groups may be stored in the form of a table, where entries in the table correspond to various input patterns or input pattern characteristics such as pattern width, and where each table entry provides either a list of shots in the shot group, or information for how to generate the appropriate set of shots. Additionally, different shot groups may be stored in different forms in the shot group library. In some embodiments, the dosage pattern which a given shot group can produce may also be stored in the shot group library. In one embodiment, the dosage pattern may be stored as a two-dimensional (X and Y) dosage map called a glyph.

The fracturing, mask data preparation, proximity effect correction and shot group creation flows described in this disclosure may be implemented using general-purpose computers with appropriate computer software as computation devices. Due to the large amount of calculations required, multiple computers or processor cores may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. In one embodiment, the special-purpose hardware device may be a graphics processing unit (GPU). In another embodiment, the optimization and simulation processes described in this disclosure may include iterative processes of revising and recalculating possible solutions, so as to minimize either the total number of shots, or the total charged particle beam writing time, or some other parameter. In yet another embodiment, an initial set of shots may be determined in a correct-by-construction method, so that no shot modifications are required.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for fracturing, mask data preparation, proximity effect correction and optical proximity correction may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for optical proximity correction (OPC) or mask data preparation (MDP) for use with charged particle beam lithography, the method comprising:
inputting a desired substrate pattern for a substrate;
inputting a desired reticle pattern for a reticle, wherein the desired reticle pattern has been determined from the desired substrate pattern;
inputting a preliminary mask model;
determining a preliminary set of charged particle beam shots, wherein the determining comprises calculating a calculated preliminary reticle pattern that will be formed on the reticle using the preliminary set of shots, wherein the calculating uses the preliminary mask model, and wherein the calculated preliminary reticle pattern approximates the desired reticle pattern;
inputting a final mask model; and
modifying the preliminary set of shots, or a set of shots derived from the preliminary set of shots, to create an optimized set of shots, wherein the modifying comprises calculating a final pattern that will be formed on the reticle using the optimized set of shots, wherein calculating the final pattern uses the final mask model, wherein the modifying comprises calculating a substrate pattern that will be formed on the substrate with an optical lithographic process using a mask formed from the optimized set of shots, and wherein the modifying is performed using a computing hardware device.

2. The method of claim 1 wherein the desired reticle pattern that has been inputted has been determined using inverse lithography technology (ILT), and wherein the ILT excludes rectilinearization.

3. The method of claim 1, further comprising determining the desired pattern for the reticle using inverse lithography technology (ILT).

4. The method of claim 3 wherein the desired pattern for the reticle comprises one or more complex shapes, wherein a complex shape comprises a polygon with non-manhattan, non-45 degree edges.

5. The method of claim 1 wherein a reticle made using the optimized set of shots is capable of forming a pattern on the substrate that more closely approximates the desired substrate pattern than would a reticle made using the preliminary set of shots.

6. The method of claim 5 wherein the reticle made using the optimized set of shots is capable of forming a pattern on the substrate that more closely approximates the desired substrate pattern, under a range of different manufacturing conditions.

7. The method of claim 1 wherein modifying the preliminary set of shots comprises adding or deleting shots.

8. The method of claim 1 wherein calculating the final pattern comprises charged particle beam simulation.

9. The method of claim 8 wherein the charged particle beam simulation includes at least one of a group consisting of forward scattering, backward scattering, resist diffusion, Coulomb effect, etching, fogging, loading and resist charging.

10. The method of claim 8 wherein the charged particle beam simulation uses a model comprising a plurality of Gaussians.

11. The method of claim 1 wherein calculating the substrate pattern comprises lithography simulation.

12. The method of claim 1 wherein the calculated preliminary reticle pattern is targeted to approximate the desired reticle pattern within 4 nm in mask dimensions.

13. The method of claim 1 wherein the final pattern on the reticle is targeted to be within 1 nm in substrate dimensions of the desired substrate pattern.

14. The method of claim 1 wherein the final mask model is more detailed or more accurate than the preliminary mask model.

15. A method for optical proximity correction (OPC) or mask data preparation (MDP) for use with charged particle beam lithography, the method comprising:
inputting a preliminary mask model;
determining a preliminary set of charged particle beam shots, wherein the determining comprises calculating a reticle pattern that will be formed on a reticle using the preliminary set of shots, wherein the calculating uses the preliminary mask model;
inputting a final mask model, wherein the final mask model is more detailed or more accurate than the preliminary mask model; and
modifying the preliminary set of shots, or a set of shots derived from the preliminary set of shots, to create an optimized set of shots, wherein the modifying comprises calculating a final pattern that will be formed on the reticle using the optimized set of shots, wherein calculating the final pattern uses the final mask model, and wherein the modifying is performed using a computing hardware device.

16. The method of claim 15 wherein the preliminary mask model is a Gaussian.

17. The method of claim 15, further comprising inputting a desired reticle pattern for the reticle, wherein the modifying comprises optimizing the final pattern.

18. The method of claim 15 wherein the modifying comprises optimizing process variation (PV) band of the final pattern.

19. The method of claim 15 wherein the modifying comprises optimizing mask error enhancement factor (MEEF) of the final pattern.

20. A method for mask data preparation (MDP) for use with charged particle beam lithography comprising:
inputting a desired pattern for a reticle;
inputting a preliminary set of charged particle beam shots, wherein, using a preliminary mask model, the preliminary set of shots has been determined to approximately form the desired pattern on the reticle;
inputting a final mask model, wherein the final mask model is more detailed or more accurate than the preliminary mask model; and
modifying the preliminary set of shots to create an optimized set of shots, wherein the modifying comprises calculating a final pattern that will be formed on the reticle using the optimized set of shots, wherein the calculating uses the final mask model, and wherein the modifying is performed using a computing hardware device.

21. The method of claim 20 wherein the modifying comprises optimizing the final pattern on the reticle.

22. The method of claim 20 wherein the final mask model includes at least one effect selected from the group consisting of forward scattering, backward scattering, Coulomb effect, fogging, loading and reticle resist charging, reticle resist bake, reticle resist development, and reticle etch.

23. The method of claim 20 wherein calculating the final pattern comprises charged particle beam simulation.

24. A method for optical proximity correction (OPC) or mask data preparation (MDP) for use with charged particle beam lithography, the method comprising:
inputting a preliminary set of charged particle beam shots, the preliminary set of shots being previously generated, using a preliminary mask model, to approximately form a desired reticle pattern;
inputting a desired substrate pattern for a substrate;
inputting a final mask model, wherein the final mask model is more detailed or more accurate than the preliminary mask model; and
modifying the preliminary set of shots to create an optimized set of shots, wherein the step of modifying comprises calculating a final reticle pattern that will be formed on a reticle using the optimized set of shots, wherein the calculating uses the final mask model, wherein the modifying comprises calculating a substrate pattern that will be formed on the substrate with an optical lithographic process using a reticle formed from the optimized set of shots, and wherein the modifying is performed using a computing hardware device.

25. The method of claim 24 wherein the modifying comprises adding or deleting shots.

26. The method of claim 25 wherein the modifying reduces the shot count.

27. The method of claim 24, further comprising outputting the optimized set of shots.

28. The method of claim 24 wherein calculating the final reticle pattern comprises charged particle simulation.

29. The method of claim 24 wherein calculating the substrate pattern comprises lithography simulation.

30. The method of claim 24 wherein calculating the substrate pattern comprises using a substrate model.

31. The method of claim 30 wherein the substrate model includes optical lithography effects.

32. The method of claim 30 wherein the substrate model includes a substrate processing effect selected from the group consisting of substrate resist bake and substrate resist development.

33. The method of claim 24 wherein the modifying comprises optimizing a parameter selected from the group consisting of critical dimension (CD) of the substrate pattern, critical dimension uniformity (CDU) of the substrate pattern, depth of focus (DOF) of the substrate pattern, process variation (PV) band of the substrate pattern, exposure latitude (EL) of the substrate pattern, and mask error enhancement factor (MEEF) of the substrate pattern.

* * * * *